United States Patent
Nabeta et al.

(10) Patent No.: US 8,546,508 B2
(45) Date of Patent: Oct. 1, 2013

(54) SEALANT OR FILLER FOR ELECTRICAL AND ELECTRONIC COMPONENTS, AND ELECTRICAL AND ELECTRICAL COMPONENTS

(75) Inventors: Akiko Nabeta, Chiba (JP); Kazumi Nakayoshi, Sodegaura (JP)

(73) Assignee: Dow Corning Toray Co., Ltd., Tokyo (JP)

( * ) Notice: Subject to any disclaimer, the term of this patent is extended or adjusted under 35 U.S.C. 154(b) by 221 days.

(21) Appl. No.: 13/126,275

(22) PCT Filed: Oct. 15, 2009

(86) PCT No.: PCT/JP2009/068154
§ 371 (c)(1),
(2), (4) Date: Jun. 2, 2011

(87) PCT Pub. No.: WO2010/050395
PCT Pub. Date: May 6, 2010

(65) Prior Publication Data
US 2011/0245426 A1    Oct. 6, 2011

(30) Foreign Application Priority Data
Oct. 31, 2008 (JP) .................................. 2008-282604

(51) Int. Cl.
*C08G 77/20* (2006.01)
(52) U.S. Cl.
USPC ............................................. 528/32; 528/31
(58) Field of Classification Search
USPC ..................................................... 528/31, 32
See application file for complete search history.

(56) References Cited

U.S. PATENT DOCUMENTS

| 4,072,635 | A | 2/1978 | Jeram |
| 4,374,967 | A | 2/1983 | Brown et al. |
| 6,303,728 | B1 * | 10/2001 | Hagimori et al. ............ 528/15 |
| 2009/0105395 | A1 * | 4/2009 | Kamata et al. ............ 524/502 |

FOREIGN PATENT DOCUMENTS

| JP | 48-17847 | 3/1973 |
| JP | 58-7452 | 1/1983 |
| JP | 03-019269 A | 1/1991 |

OTHER PUBLICATIONS

International Search Report for Application No. PCT/JP2009/068154 dated Jan. 28, 2010, 3 pages.
English language abstract for JP 03-019269 extracted from the PAJ database on Feb. 3, 2012, 12 pages.

* cited by examiner

*Primary Examiner* — Kuo-Liang Peng
(74) *Attorney, Agent, or Firm* — Howard & Howard Attorneys PLC

(57) ABSTRACT

A sealant or filler of the invention for electrical and electronic components comprises a two or more liquid type organopolysiloxane composition curable by a hydrosilylation reaction, the viscosity of the composition being doubled at room temperature during 10 min. or more from the initial value obtained directly after mixing all the components, and being increased at room temperature from 5-fold to 10-fold of the initial viscosity within another 10 min. The sealant or filler for electrical and electronic components can be cured to a sufficient degree at room temperature and improve reliability of the sealed or filled components.

12 Claims, No Drawings

SEALANT OR FILLER FOR ELECTRICAL AND ELECTRONIC COMPONENTS, AND ELECTRICAL AND ELECTRICAL COMPONENTS

RELATED APPLICATIONS

This application claims priority to and all the advantages of International Patent Application No. PCT/JP2009/068154, filed on Oct. 15, 2009, which claims priority to Japanese Patent Application No. JP2008-282604, filed on Oct. 31, 2008.

TECHNICAL FIELD

The present invention relates to a sealant or filler for electrical and electronic components, and to electrical and electronic components sealed or filled with the aforementioned sealant or filler, respectively.

BACKGROUND ART

It is known in the art to seal or fill electrical and electronic components with organopolysiloxane compositions curable by a hydrosilylation reaction. Such compositions can be exemplified, e.g., by the following: a composition that comprises a branched-chain organopolysiloxane having vinyl groups, a linear-chain organopolysiloxane having silicon-bonded hydrogen atoms, and a hydrosilylation reaction catalyst {see Japanese Unexamined Patent Application Publication (hereinafter referred to as "Kokai") S48-17847}; a composition that comprises a branched-chain organopolysiloxane having vinyl groups, an organopolysiloxane having silicon-bonded hydrogen atoms, and a hydrosilylation reaction catalyst (see Kokai S58-7452); and a composition that comprises a branched-chain organopolysiloxane having vinyl groups, a linear-chain organopolysiloxane capped at both molecular terminals with vinyl groups, a linear-chain organopolysiloxane having silicon-bonded hydrogen atoms only at both molecular terminals, and a hydrosilylation reaction catalyst (see Japanese Examined Patent Application Publication H03-19269).

In general, the compositions of the aforementioned type are cured by heating. Recently, however, in order to protect the environment, investigations were carried out aimed at decreasing amounts of $CO_2$ formed during sealing or filling of electric and electronic components associated with heating.

However, curing of the aforementioned compositions at room temperature results, either in incomplete curing, or produces cured bodies of insufficient hardness. Furthermore, reliability testing of electric and electronic components sealed or filled with the aforementioned composition reveals that hardness of a cured body changes with the lapse of time thus impairing reliability of the sealed or filled components.

It is an object of the present invention to provide a sealant or filler for electrical and electronic components that ensures sufficient curing at room temperature and makes it possible to improve reliability of the sealed or filled components. It is another object to provide electrical and electronic components that possess sufficient reliability.

DISCLOSURE OF INVENTION

A sealant or filler of the invention for electrical and electronic components that comprises a two or more liquid type organopolysiloxane composition curable by a hydrosilylation reaction, the viscosity of the composition being doubled at room temperature during 10 min. or more from the initial value obtained directly after mixing all the components, and being increased at room temperature from 5-fold to 10-fold of the initial viscosity within another 10 min.

The aforementioned organopolysiloxane composition curable by a hydrosilylation reaction may be a two-liquid type composition that comprises liquid A and liquid B, wherein liquid A comprises (a) a branched-chain or linear-chain organopolysiloxane having in one molecule at least two alkenyl groups, and (b) a linear-chain organopolysiloxane having silicon-bonded hydrogen atoms at both molecular terminals {this component is contained in such an amount that 0.1 to 10 moles of the silicon-bonded hydrogen atoms of this component is present per 1 mole of the all the alkenyl groups of component (a) present in the composition}, liquid A being free of (c) a hydrosilylation reaction catalyst; and liquid B comprises component (a) and component (c) (in a catalytic quantity) but is free of component (b).

Component (a) may be an organopolysiloxane that contains alkenyl groups bonded at least to the molecular terminals. More specifically, this may be a branched-chain organopolysiloxane that has alkenyl groups only on molecular terminals, in particular, a mixture of branched-chain organopolysiloxanes of at least two types that contain alkenyl groups bonded only to the molecular terminals.

Component (a) may comprise a linear-chain organopolysiloxane that contains alkenyl groups bonded to both molecular terminals and to side molecular chains.

Electrical and electronic components of the invention are characterized by being sealed or filled at room temperature with the aforementioned sealant or filler for electrical and electronic components.

EFFECTS OF INVENTION

The sealant or filler of the invention for electrical and electronic components can provide sufficient curing at room temperature, and can improve reliability of the sealed or filled electrical and electronic components. The components, in turn, are characterized by reliability.

DETAILED DESCRIPTION OF THE INVENTION

Let us first consider in more detail the sealant or filler of the present invention for sealing and filling electrical and electronic components.

The sealant or filler for electrical and electronic components comprises a two or more liquid type organopolysiloxane composition curable by a hydrosilylation reaction. The viscosity of the composition is doubled at room temperature during 10 min. or more from the initial value obtained directly after mixing all the components. Furthermore, the viscosity of the composition is increased at room temperature from 5-fold to 10-fold of the initial viscosity within another 10 min.

Since the sealant or filler of the invention is characterized by a progress of the curing reaction directly after all the components are mixed at room temperature and since it takes 10 min. or more for the viscosity to reach its doubled value from the initial one, it becomes possible for the composition to penetrate into narrow spaces and to seal and fill intricate components. What is meant herein under the term "room temperature" is a normal temperature, specifically a temperature in the range of 10 to 40° C., preferably 15 to 35° C., and most preferably, 20±5° C. Although there are no special restrictions with regard to the upper limit of the initial viscosity of the sealant or filler of the invention at 25° C., it is recommended that the initial viscosity does not exceed 15,000 mPa·s, and more preferably not exceed 10,000 mPa·s, further preferably not exceed 8,000 mPa·s, and most preferably not exceed 5,000 mPa·s, and even not exceed 2,000 mPa·s. On the other hand, although there are no special restrictions with regard to the lower limit of the initial viscosity at 25° C., it is recommended that this value be not less than 10 mPa·s, preferably not less than 50 mPa·s, more preferably not less than 100 mPa·s, and most preferably not less than 150 mPa·s.

Since the viscosity of the composition is increased at room temperature from 5-fold to 10-fold of the initial viscosity within another 10 min., the curing reaction progresses quickly whereby curing is rapidly completed at room temperature. The features described above make it possible to shorten heating operations associated with sealing and curing of the electrical and electronic components, to protect the electrical and electronic components from development of thermal stress, and to seal or fill semiconductors, capacitors, electrical resistors, or other elements of low thermal resistance that may be incorporated into electric circuits or modules.

There are no special restrictions with regard to the state of a cured body obtained by curing the sealant or filler, and the cured body may be obtained in the form of gel, and low-hardness rubber. In particular, resistance of the electrical and electronic components to impact loads and to heat cycles can be improved if the sealant or filler is obtained in the form of gel-like body having ¼ consistency defined in JIS K 2220 of 10 to 150.

The sealant or filler of the invention comprises a two or more liquid type organopolysiloxane composition that is curable by a hydrosilylation reaction. This means that the sealant or filler may consist of two liquids, three liquids, four liquids, or more. However, a two-liquid type or a three-liquid type organopolysiloxane is preferable, and a two-liquid type is most preferable. For example the two-liquid type organopolysiloxane may comprise liquid A and liquid B, wherein liquid A comprises (a) a branched-chain or linear-chain organopolysiloxane having in one molecule at least two alkenyl groups, and (b) a linear-chain organopolysiloxane having silicon-bonded hydrogen atoms at both molecular terminals {this component is contained in such an amount that 0.1 to 10 moles of the silicon-bonded hydrogen atoms of this component is present per 1 mole of the all the alkenyl groups of component (a) present in the composition}, liquid A being free of (c) a hydrosilylation reaction catalyst; and liquid B that comprises component (a) and component (c) (in a catalytic quantity) but is free of component (b).

Component (a), which is the main agent of the sealant or filler, is a branched-chain or linear-chain organopolysiloxane having in one molecule at least two alkenyl groups. Although there are no special restrictions with regard to viscosity of component (a) at 25° C., it is recommended that the viscosity be in the range of 10 to 100,000 mPa·s. If the viscosity is below the recommended lower limit, this will impair physical properties of the obtained cured body. If, on the other hand, the viscosity exceeds the recommended upper limit, this will impair handleability and workability of the sealant or filler.

The branched-chain organopolysiloxane may have a branched or a partially branched linear molecular structure. A specific example is an organopolysiloxane, the molecular structure of which contains $RSiO_{3/2}$ units (where R designates a monovalent hydrocarbon group) and/or $SiO_{4/2}$ units. The branched organopolysiloxane may comprise a single polymer or a mixture of at least two types of the polymers. There are no special restrictions with regard to a ratio in which the component organopolysiloxanes can be used when two types of organopolysiloxanes are mixed, but in general it may be recommended to use a weight ratio of (9:95) to (95:5), preferably (10:90) to (90:10), and most preferably (20:80) to (80:20).

The branched-chain organopolysiloxane may comprise a polymer composed of $R_2SiO_{2/2}$ units, $RSiO_{3/2}$ units, and $R_3SiO_{1/2}$ units. In the above units, R designates univalent hydrocarbon groups such as methyl, ethyl, propyl, or a similar alkyl group; vinyl, allyl, butenyl, hexenyl, or a similar alkenyl group; phenyl, tolyl, or a similar aryl group; 3,3,3-trifluoropropyl, or a similar halogenated alkyl group; the polymer may also contain a very small quantities of hydroxyl groups; methoxy groups, or similar alkoxy groups, but in the aforementioned polymer at least two groups designated by R must be alkenyl groups. Although there are no special restrictions with regard to the content of the units in the polymer, in general the content of $R_2SiO_{2/2}$ units should be in the range of 80.00 to 99.65 mole %, of $RSiO_{3/2}$ units in the range of 0.10 to 10.00 mole %, and the $R_3SiO_{1/2}$ units being the balance.

Another branched-chain organopolysiloxane is a polymer composed of $R_2SiO_{2/2}$ units, $SiO_{4/2}$ units, and $R_3SiO_{1/2}$ units. In these units, R designates the same univalent hydrocarbon groups as those mentioned above. Hydroxyl groups; and methoxy groups, or similar alkoxy groups may be allowed in a very small quantities, but, in the aforementioned polymer at least two groups designated by R must be alkenyl groups. Although there are no special restrictions with regard to the content of the units in the polymer, in general the content of $R_2SiO_{2/2}$ units should be in the range of 80.00 to 99.65 mole %, of $SiO_{4/2}$ units in the range of 0.10 to 10.00 mole %, and $R_3SiO_{1/2}$ units being the balance.

The linear-chain organopolysiloxane is an organopolysiloxane that has a linear-molecular structure. Silicon-bonded organic groups contained in this organopolysiloxane may be exemplified by univalent hydrocarbon groups, such as methyl, ethyl, propyl, or similar alkyl groups; vinyl, allyl, butenyl, hexenyl, or similar alkenyl groups; phenyl, tolyl, or similar aryl groups; 3,3,3-trifluoropropyl, or similar halogenated alkyl groups. At least two alkenyl groups must be present. The aforementioned linear-chain organopolysiloxane can be exemplified by the following compounds: a dimethylpolysiloxane capped at both molecular terminals with dimethylvinylsiloxy groups; a copolymer of a methylphenylsiloxane and a dimethylsiloxane capped at both molecular terminals with dimethylvinylsiloxy groups; a copolymer of a methylvinylsiloxane and a dimethylsiloxane capped at both molecular terminals with trimethylsiloxy groups; a copolymer of a methylphenylsiloxane, methylvinylsiloxane, and a dimethylsiloxane capped at both molecular terminals with trimethylsiloxy groups; a copolymer of a methylvinylsiloxane and a dimethylsiloxane capped at both molecular terminals with silanol groups; the aforementioned polymers wherein a part of the methyl groups is substituted with ethyl groups, propyl groups, or similar alkyl groups other than methyl groups, as well as with 3,3,3-trifluoropropyl, or similar halogenated alkyl groups; the aforementioned polymers wherein a part of the vinyl groups is substituted with allyl groups, butenyl groups, hexenyl groups, or similar alkenyl groups other than vinyl groups, as well mixtures of two or more of the above polymers. Most preferable is the organopolysiloxane having alkenyl groups on both molecular terminals and in side chains.

Component (b) is a cross-linking agent of the sealant or filler of the invention. It comprises a linear-chain organopolysiloxane that has silicon-bonded hydrogen atoms at the molecular terminals. There are no special restrictions with regard to viscosity of component (b) at 25° C., but it is preferable that the viscosity be in the range of 1 to 10,000 mPa·s. If the viscosity is below the recommended lower limit, this will impair physical properties of the obtained cured body, and if, on the other hand, the viscosity exceeds the recommended upper limit, this will impair handleability and workability of the sealant or filler. Silicon-bonded organic groups contained in component (b) may be represented by methyl, ethyl, propyl or similar alkyl groups; phenyl, tolyl, or similar aryl groups; 3,3,3-trifluoropropyl, or similar halogenated alkyl groups, and other univalent hydrocarbon groups, except for alkenyl groups.

Aforementioned component (b) can be exemplified by the following compounds: a dimethylpolysiloxane capped at both molecular terminals with dimethylhydrogensiloxy groups; a copolymer of a methylphenylsiloxane and a dimethylsiloxane capped at both molecular terminals with dimethylhydrogensiloxy groups; a copolymer of a methylhydrogensiloxane and a dimethylsiloxane capped at both molecular terminals with dimethylhydrogensiloxy groups; the aforementioned polymers wherein a part of the methyl groups is substituted with ethyl, propyl, or similar alkyl groups other than methyl groups or with 3,3,3-trifluoropropyl groups or other halogenated alkyl groups; as well as a mixture of two or more of the above-mentioned polymers. Most preferable are linear-chain organopolysiloxanes having silicon-bonded hydrogen atoms only on both molecular terminals.

In the composition of the invention, component (b) is used in such an amount that 0.1 to 10 moles, preferably 0.5 to 5 moles, and most preferably 0.5 to 2 moles of the silicon-bonded hydrogen atoms of this component are present per 1 mole of all alkenyl groups of component (a) in the composition. If component (b) is contained in an amount below the recommended lower limit, the obtained sealant or filler will be insufficiently cured, and if, on the other hand, the content of component (b) exceeds the recommended upper limit, this will impair physical properties of the obtained cured body.

Component (c) is a hydrosilylation reaction catalyst that promotes curing of the sealant or filler of the invention. Component (c) can be exemplified by chloroplatinic acid, an alcohol solution of chloroplatinic acid, a platinum-olefin complex, a platinum complex of 1,3-divinyl-1,1,3,3-tetramethyldisiloxane, a platinum-carrying powder, or similar platinum-based catalysts; tetrakis(triphenylphosphine) palladium, palladium black, a mixture of a palladium-based catalysts with triphenylphosphine, or similar palladuium catalysts; and rhodium-based catalysts. The platinum-based catalysts are preferable.

In the sealants or fillers of the invention, component (c) is used in catalytic quantities. When platinum-based catalysts are used, then in terms of weight units they are added in an amount of 0.01 to 1,000 ppm, and preferably 0.1 to 500 ppm.

If necessary, the sealant or filler can be combined with arbitrary components such as acetylene compounds, organic phosphorous compounds, vinyl-containing siloxane compounds, or similar hydrosilylation-reaction adjusters; fumed silica, wet-process silica, crushed quartz, titanium oxide, magnesium carbonate, zinc oxide, iron oxide, diatomaceous earth, carbon black, or similar inorganic fillers; the aforementioned inorganic fillers surface-treated with organic silicon compounds; flame retarders, heat-resistant additives, pigments, and dyes.

The following is a more detailed description of electrical and electronic components of the invention.

Electrical and electronic components of the invention are those components, which are sealed or filled at room temperature with the sealants or fillers of the invention. Electrical and electronic components are exemplified by electric circuits or modules which incorporate IC's, hybrid IC's, LSTs, or similar semiconductor elements, capacitors, electrical resistors, or similar electrical elements into the electric circuits or modules, and are sealed or filled with silicone gel. Specific examples of such components are the following: power IC's for various motor-control systems used in office automation equipment, information systems, automobiles, domestic electrical appliances, factory automation systems, and other, 200 V line operating power IC's used in the field of electric power sources, high side switches for lamp/solenoid drive in the field of automobiles, or similar power IC; high current and high-capacity modules formed by assembling a plurality of power semiconductors into a single package, igniters and regulators for use in vehicles, or other components. The power modules are preferably.

EXAMPLES

The sealants or fillers of the invention for electrical and electronic components and the components themselves will now be further described in more details with reference to application and comparative examples. In these examples, respective characteristics have values measured at 25° C. Furthermore, properties of sealants or fillers for electrical and electronic components and cured bodies thereof were measured by methods described below.

[Viscosity]

A two-liquid type organopolysiloxane composition curable by a hydrosilylation reaction was prepared from liquid A and liquid B shown in Table 1. Viscosity of the composition was measured with a rotary-type viscometer (Digital Viscometer DVH-B-411 of Tokimec Co., Ltd.) directly after liquids A and B were mixed. This viscosity was considered as to be the initial viscosity. Following this, the viscosity at 25° C. was measured at predetermined periods of time. More specifically, the time was measured during which viscosity had a 2-fold increase and a 5-fold to 10-fold increase, as compared to the initial viscosity. The results are shown in Table 1.

[¼ Consistency of Cured Body]

The sealant or filler for electrical and electronic components was slowly poured into a 50 ml glass beaker, and then, 30 minutes after the liquid doubled its viscosity, ¼ consistency of the cured body was measured in accordance with the procedure specified in JIS K 2220. The ¼ consistency of the cured body was measured by the same method 120 minutes after the doubled viscosity increase. Judgment on sufficiency of curing was made based on the change in the ¼ consistency. The results are shown in Table 1.

Application Examples 1 to 6

Liquids A and B were prepared by mixing components shown in Table 1 given below. Next, sealants or filler for electrical and electronic components were prepared by mixing liquids A and B at 25° C. SiH/SiCH=$CH_2$ shown in Table 1 designates the mole ratio of silicon-bonded hydrogen atoms of component (b) to 1 mole of all alkenyl groups contained in components (a-1) to (a-4) of the respective sealants or fillers.

Component (a-1): A branched-chain organopolysiloxane (content of vinyl groups=0.22 wt. %) having viscosity of 530 mPa·s and consisting of 94.8 mole % of $(CH_3)_2SiO_{2/2}$ units, 2.6 mole % of $CH_3SiO_{3/2}$ units, 2.0 mole % of $(CH_3)_3SiO_{1/2}$, and 0.6 mole % of $(CH_3)_2(CH_2=CH)SiO_{1/2}$ units Component (a-2): A branched-chain organopolysiloxane (content of vinyl groups=0.18 wt. %) having viscosity of 370 mPa·s and consisting of 94.5 mole % of $(CH_3)_2SiO_{2/2}$ units, 2.7 mole % of $CH_3SiO_{3/2}$ units, 2.3 mole % of $(CH_3)_3SiO_{1/2}$, and 0.5 mole % of $(CH_3)_2 (CH_2=CH) SiO_{1/2}$ units Component (a-3): A branched-chain organopolysiloxane (content of vinyl groups=0.69 wt. %) having viscosity of 350 mPa·s and consisting of 97.6 mole % of $(CH_3)_2SiO_{2/2}$ units, 1.9 mole % of $(CH_3)_2 (CH_2=CH) SiO_{1/2}$ units, and 0.5 mole % of $SiO_{4/2}$ units Component (a-4): A copolymer of methylvinylsiloxane and dimethylsiloxane having viscosity of 620 mPa·s, and capped at both molecular terminals with dimethylvinylsiloxy groups (content of vinyl groups=1.21 wt. %)

Component (b): A dimethylpolysiloxane having viscosity of 15 mPa·s and capped at both molecular terminals with dimethylhydrogensiloxy groups (content of silicon-bonded hydrogen atoms=0.13 wt. %)

Component (c): A platinum complex of 1,3-divinyl-1,1,3,3-tetramethyldisiloxane (platinum concentration 0.5 wt. %; content of vinyl groups=2.48 wt. %)

Component (d-1): 2-phenyl-3-butyn-2-ol

Component (d-2): 1-ethynyl-1-cyclohexanol

TABLE 1

|  |  | Application Examples | | | | | |
|---|---|---|---|---|---|---|---|
|  |  | 1 | 2 | 3 | 4 | 5 | 6 |
| Composition of liquid (A) | (a-1) (parts by weight) | — | — | 48.4 | 48.4 | 48.4 | 48.4 |
|  | (a-2) (parts by weight) | — | — | 48.4 | 48.4 | 48.4 | 48.4 |
|  | (a-3) (parts by weight) | 35.7 | — | — | — | — | — |
|  | (a-4) (parts by weight) | — | 37.4 | — | — | — | — |
|  | (b) (parts by weight) | 28.7 | 25.2 | 6.4 | 6.6 | 6.6 | 6.7 |
|  | (d-1) (ppm)* | 13 | 10 | — | 16 | 23 | 92 |
|  | (d-2) (ppm)* | 2500 | — | — | — | — | — |
| Composition of liquid (B) | (a-1) (parts by weight) | — | — | 51.6 | 51.6 | 51.6 | 51.6 |
|  | (a-2) (parts by weight) | — | — | 51.6 | 51.6 | 51.6 | 51.6 |
|  | (a-3) (parts by weight) | 64.3 | — | — | — | — | — |
|  | (a-4) (parts by weight) | — | 62.6 | — | — | — | — |
|  | (c) (ppm)* | 70 | 50 | 12 | 11 | 11 | 11 |
| SiH/SiCH=CH$_2$ |  | 1.5 | 0.7 | 0.6 | 0.6 | 0.6 | 0.6 |
| Initial viscosity (mPa · s) |  | 200 | 400 | 350 | 350 | 350 | 350 |
| Time to viscosity doubling (min.) |  | 50 | 18 | 18 | 23 | 24 | 56 |
| Time from 5-fold to 10-fold viscosity (min.) |  | 1 | 3 | 1 | 1 | 1 | 1 |
| 1/4 consistency after 30 minutes from 2-fold viscosity (mm/10) |  | 2 | 3 | 129 | 128 | 130 | 140 |
| 1/4 consistency after 120 minutes from 2-fold viscosity (mm/10) |  | 2 | 3 | 126 | 125 | 125 | 126 |

*Measured in weight units per composition after liquids A and B were mixed

INDUSTRIAL APPLICABILITY

Since the sealants or fillers of the invention for electrical and electronic components provide sufficient curing at room temperature and improve reliability of the sealed or filled components, they are suitable for sealing or filling parts of power modules and control units used in vehicles.

The invention claimed is:

1. A sealant or filler for electrical and electronic components comprising a two or more liquid type organopolysiloxane composition curable by a hydrosilylation reaction, the viscosity of the composition being doubled at room temperature during 10 min, or more from the initial value obtained directly after mixing all the components, and being increased at room temperature from 5-fold to 10-fold of the initial viscosity within another 10 min.

2. The sealant or filler for electrical and electronic components according to claim 1, wherein the organopolysiloxane composition curable by a hydrosilylation reaction is a two-liquid type composition that comprises liquid A and liquid B, wherein liquid A comprises (a) a branched-chain or linear-chain organopolysiloxane having in one molecule at least two alkenyl groups, and (b) a linear-chain organopolysiloxane having silicon-bonded hydrogen atoms at both molecular terminals, wherein component (b) is contained in such an amount that 0.1 to 10 moles of the silicon-bonded hydrogen atoms of component (b) are present per 1 mole of the all the alkenyl groups of component (a) in the composition, and wherein liquid A is free of (c) a hydrosilylation reaction catalyst; and liquid B comprises component (a) and component (c) in a catalytic quantity but is free of component (b).

3. The sealant or filler for electrical and electronic components according to claim 2, wherein component (a) is an organopolysiloxane that contains alkenyl groups bonded at least to the molecular terminals.

4. The sealant or filler for electrical and electronic components according to claim 2, wherein component (a) is an organopolysiloxane that contains alkenyl groups bonded only to the molecular terminals.

5. The sealant or filler for electrical and electronic components according to claim 2, wherein component (a) comprises a mixture of branched-chain organopolysiloxanes of at least two types that contain alkenyl groups bonded only to the molecular terminals.

6. The sealant or filler for electrical and electronic components according to claim 2, wherein component (a) is a linear-chain organopolysiloxane that contains alkenyl groups bonded to both molecular terminals and to side molecular chains.

7. The sealant or filler for electrical and electronic components according to claim 6, wherein component (b) is a linear-chain organopolysiloxane having silicon-bonded hydrogen atoms only at both molecular terminals.

8. The sealant or filler for electrical and electronic components according to claim 2, wherein component (b) is a linear-chain organopolysiloxane having silicon-bonded hydrogen atoms only at both molecular terminals.

9. An electrical or electronic component, which is sealed or filled at room temperature with the sealant or filler for electrical and electronic components according to claim 1.

10. The sealant or filler for electrical and electronic components according to claim 1, wherein the initial viscosity of the sealant or filler is from 10 mPa·s to 15,000 mPa·s.

11. The sealant or filler for electrical and electronic components according to claim 1, wherein the initial viscosity of the sealant or filler is from 50 mPa·s to 10,000 mPa·s.

12. The sealant or filler for electrical and electronic components according to claim 1, wherein the initial viscosity of the sealant or filler does not exceed 2,000 mPa·s.

* * * * *